United States Patent [19]
Choi

[11] Patent Number: 5,767,696
[45] Date of Patent: Jun. 16, 1998

[54] TRI-STATE DEVICES HAVING EXCLUSIVE GATE OUTPUT CONTROL

[75] Inventor: Hwa-Il Choi, Busankwangyeok, Rep. of Korea

[73] Assignee: Samsung Electronics Co., Ltd., Suwon, Rep. of Korea

[21] Appl. No.: 742,721

[22] Filed: Nov. 1, 1996

[30] Foreign Application Priority Data

Nov. 3, 1995 [KR] Rep. of Korea ............... 1995-39608

[51] Int. Cl.$^6$ ................................................ H03K 17/16
[52] U.S. Cl. ........................ 326/56; 326/55; 326/58
[58] Field of Search ........................ 326/9.21, 52, 55, 326/56–58

[56] References Cited

U.S. PATENT DOCUMENTS

| | | | |
|---|---|---|---|
| 4,749,886 | 6/1988 | Hedayati | 326/55 |
| 4,928,023 | 5/1990 | Marshall | 326/58 X |
| 4,968,903 | 11/1990 | Smith et al. | 326/55 X |
| 5,296,757 | 3/1994 | Koizumi | 326/56 X |
| 5,334,888 | 8/1994 | Bodas | 326/52 |
| 5,568,062 | 10/1996 | Kaplinsky | 326/27 |

*Primary Examiner*—David R. Hudspeth
*Attorney, Agent, or Firm*—Myers, Bigel, Sibley & Sajovec

[57] ABSTRACT

Tri-state devices having exclusive gate output control include a tri-state device having first and second inputs and a tri-state output, a normally-off transistor connected in series between the tri-state output and a first reference potential (e.g., VCC or VSS) and an exclusive gate (e.g., NOR, OR) having first and second inputs coupled to the first and second inputs of said tri-state device, respectively, and an output electrically coupled to a control electrode of said normally-off transistor so that the tri-state output becomes electrically connected through the normally-off transistor to the first reference potential whenever the first and second inputs of said tri-state device are at different logic potentials. However, the normally-off transistor is maintained in a nonconductive state to reduce power consumption whenever the output of the tri-state device is switched to VCC or VSS.

9 Claims, 2 Drawing Sheets

TRI-STATE DEVICES HAVING EXCLUSIVE GATE OUTPUT CONTROL

FIELD OF THE INVENTION

The present invention relates to integrated circuit devices, and more particularly to tri-state devices and methods of operating same.

BACKGROUND OF THE INVENTION

Tri-state devices are used in a large number of applications which require the establishment of a high-impedance output state in addition to "high" and "low" logic states. However, under certain conditions the occurrence of a high impedance state can cause circuits which are coupled to the output of the tri-state device to become unstable. As will be understood by those skilled in the art, FIG. 1 illustrates a prior art tri-state device. Here, if the two inputs A and B have identical logic levels, then the output "Y" of the tri-state device will switch to a logic "low" level (e.g., VSS) or a logic "high" level (e.g., VCC) depending on the value of the logic level. In particular, if the inputs A and B are all at the logic "low" levels, then logic "high" levels are generated at the outputs of inverters IG1 and IG2. When this occurs, PMOS transistors MP1 and MP2 are turned off and NMOS transistors MN1 and MN2 are turned on and pull the output Y to VSS (e.g., logic "0"). In contrast, if the inputs A and B are all at logic "high" levels, the output Y is switched to VCC (e.g., logic "1").

But, if the logic levels of the inputs A and B are different (i.e., A=0 & B=1 or A=1 & B=0), the output Y of the tri-state device enters a floating state. For example, if the input A=0 and the input B=1, then inputs A and B are inverted to logic "high" and "low" levels, respectively, via the inverters IG1 and IG2. In response, PMOS transistor MP1 and NMOS transistor MN1 are turned on and PMOS transistor MP2 and NMOS transistor MN2 are turned off. Thus, the output Y of the tri-state device become electrically disconnected from both VCC and VSS and enters a high impedance state. This is also true for the case where A=1 and B=0. The operation of the tri-state device of FIG. 1 is summarized by Table 1. The notation "Z" denotes a high impedance state.

TABLE 1

| Node | Case 1 | Case 2 | Case 3 | Case 4 |
|------|--------|--------|--------|--------|
| A    | 0      | 0      | 1      | 1      |
| B    | 0      | 1      | 0      | 1      |
| Y    | 0      | Z      | Z      | 1      |
| INA  | L      | Float  | Float  | H      |

Thus, if two inputs of the tri-state circuit as shown in FIG. 1 have different logic levels, the output signal line INA will be allowed to float. In this case, if the value of a load capacitor CL cannot sufficiently drive the fan-out of the following stage of a circuit, malfunction of the circuit may occur. In order to prevent such a malfunction, the occurrence of the floating signal line INA is prevented by adding a pull-up resistor (or a pull-down resistor) as shown in FIG. 2.

Referring now to the tri-state device of FIG. 2, if the two inputs A and B have different logic levels (e.g., A=0 & B=1, or A=1 & B=0), the output Y will enter a floating state, but the output signal line INA will be pulled to VCC by the pull-up resistor PR. Thus, the likelihood of an unstable condition is reduced. However, if the inputs A and B are at the logic "low" levels, the PMOS transistors MP1 and MP2 are turned off and the NMOS transistors MN1 and MN2 are turned on. Thus, the output Y of the tri-state device switches to a logic "low" state. When this occurs, the power supply voltage VCC will become connected to VSS via the pull-up resistor PR and the NMOS transistors MN1 and MN2. Unfortunately, this forms a continuous current path ("i path") from VCC to VSS which can be excessive. The same is true even if a pull-down resistor is used instead of the pull-up resistor PR because if inputs A and B are set at the logic "high" level, the PMOS transistors MP1 and MP2 will turn on and provide current to the pull-down resistor (not shown).

The operation of the tri-state circuit using the pull-up resistor PR can be explained by the following Table 2, and the operation of the tri-state circuit using the pull-down resistor can be explained by the following Table 3.

TABLE 2

| Node         | Case 1 | Case 2 | Case 3 | Case 4 |
|--------------|--------|--------|--------|--------|
| A            | 0      | 0      | 1      | 1      |
| B            | 0      | 1      | 0      | 1      |
| Y            | 0      | Z      | Z      | 1      |
| INA          | VSS    | VCC    | VCC    | VCC    |
| Current path | Yes    | No     | No     | No     |

TABLE 3

| Node         | Case 1 | Case 2 | Case 3 | Case 4 |
|--------------|--------|--------|--------|--------|
| A            | 0      | 0      | 1      | 1      |
| B            | 0      | 1      | 0      | 1      |
| Y            | 0      | Z      | Z      | 1      |
| INA          | VSS    | VSS    | VSS    | VCC    |
| Current path | No     | No     | No     | Yes    |

Therefore, when a pull-up or pull-down resistor is used to prevent the floating state of the tri-state device, there remains the problem of excessive power consumption due to the unnecessary current path as described above.

SUMMARY OF THE INVENTION

It is therefore an object of the present invention to provide a tri-state device which is capable of generating stable output signal lines.

It is another object of the present invention to provide a tri-state device which has reduced power requirements.

These and other objects, advantages and features of the present invention are provided by a tri-state device which has an exclusive gate output control circuit. The exclusive gate output control circuit eliminates the potentially unstable floating state condition and the high current requirements associated with prior art tri-state devices. In particular, the present invention includes a tri-state device having first and second inputs and a tri-state output "Y", a normally-off transistor connected in series between the tri-state output and a first reference potential (e.g., VCC or VSS) and an exclusive gate (e.g., XNOR, XOR) having first and second inputs. The inputs of the exclusive gate are coupled to the first and second inputs of the tri-state device, respectively. In addition, the output of the exclusive gate is electrically coupled to a gate electrode of the normally-off transistor so that the tri-state output becomes electrically connected through the normally-off transistor to the first reference potential whenever the first and second inputs of the tri-state device are at different logic potentials.

However, the normally-off transistor is maintained in a nonconductive state to reduce power consumption whenever the output Y of the tri-state device is switched to VCC or VSS.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
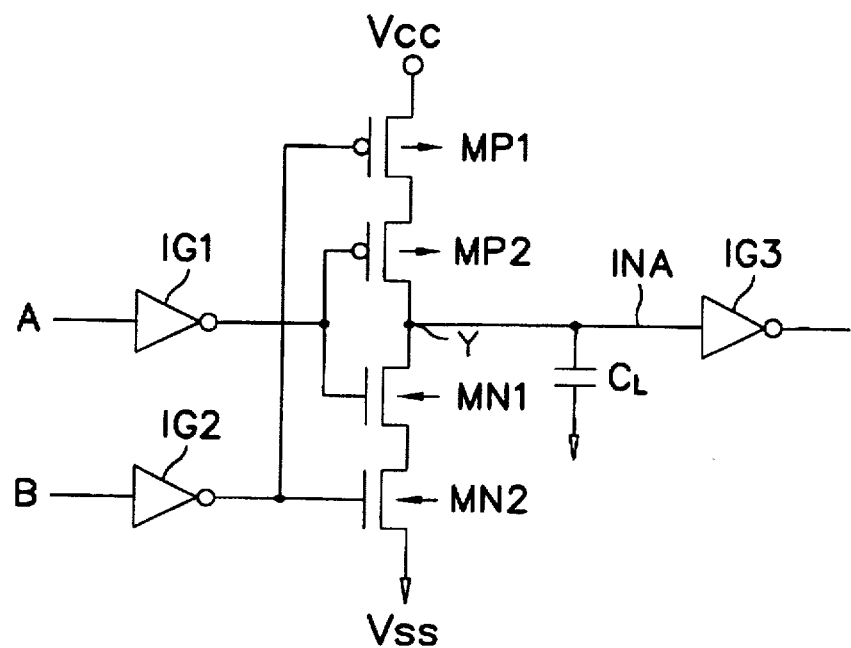
FIG. 1 is an electrical schematic of a first tri-state device according to the prior art.
Figure 2:
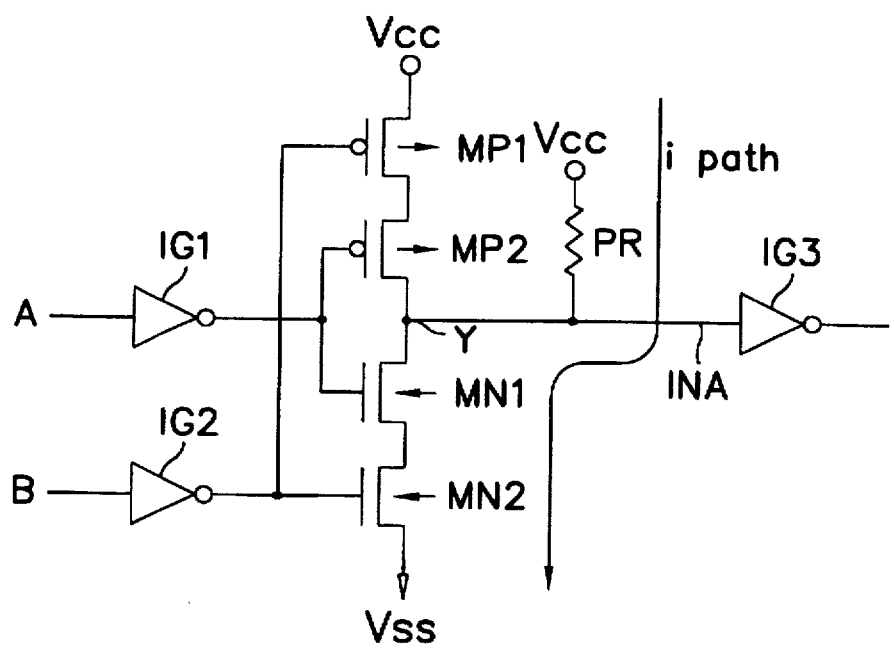
FIG. 2 is an electrical schematic of a second tri-state device according to the prior art.
Figure 3:
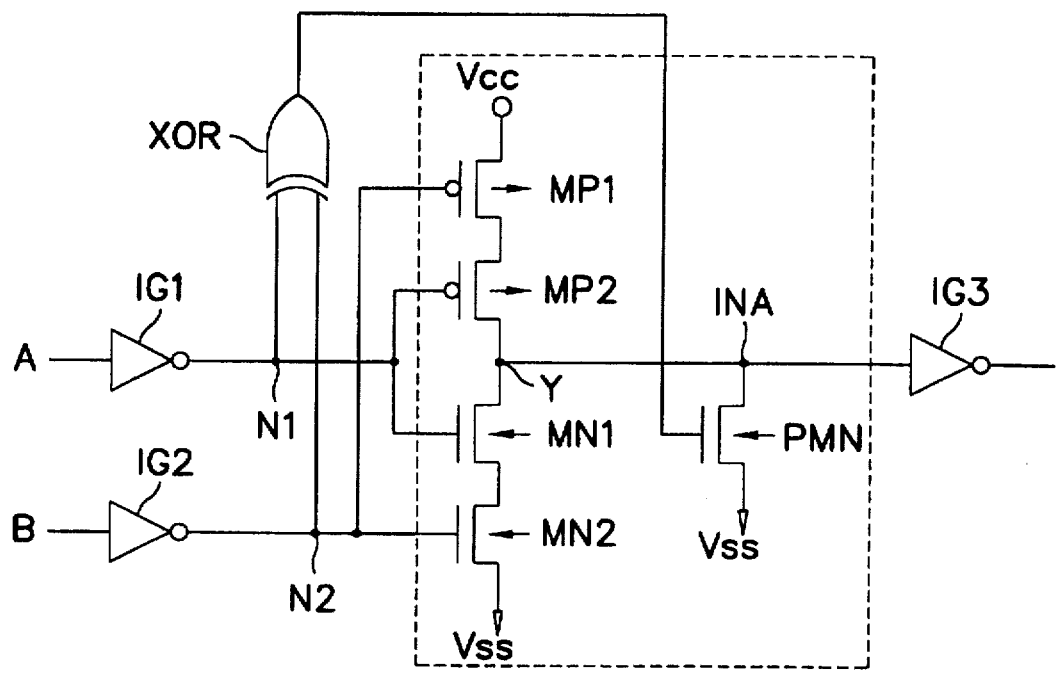
FIG. 3 is an electrical schematic of a tri-state device according to a first embodiment of the present invention.

Referring now to FIG. 3, a tri-state device according to a first embodiment of the present invention is illustrated. According to this embodiment, first and second NMOS transistors MN1 and MN2 are electrically connected in series between an output Y of the tri-state device and VSS (e.g., GND) and first and second PMOS transistors MP1 and MP2 are electrically connected in series between the output Y and the power supply potential (i.e., VCC). First and second inverters IG1 and IG2 are also provided in series between the gate electrodes of the NMOS and PMOS transistors and the inputs A and B, as illustrated. As will be understood by those skilled in the art, whenever inputs A and B are both switched to logic 1 potentials, the output Y of the tri-state device will be pulled up to VCC. Alternatively, whenever inputs A and B are both switched to logic 0 potentials, the output Y will be pulled down to VSS. However, according to the present invention, a two-input exclusive OR (XOR) gate is preferably connected between nodes N1 and N2, as illustrated, and a gate electrode of a normally-off NMOS pull-down transistor (PMN). Alternatively, a two-input exclusive NOR (XNOR) gate and a PMOS pull-down transistor (not shown) can be used in place of the illustrated XOR gate and NMOS transistor. Thus, the output signal line INA will also be pulled down to VSS whenever the inputs A and B are at different logic potentials because a logic 1 output will be generated by the XOR gate to turn on the NMOS pulled-down transistor PMN. But, because the output of the XOR gate remains at a logic 0 potential whenever the inputs A and B are the same, the NMOS pull-down transistor PMN will remain nonconductive when the inputs A and B are the same. Thus, any high current path between VCC and VSS is eliminated even when the PMOS transistors MP1 and MP2 are turned on.

In particular, referring now to FIG. 3 and Table 4, the operation of the tri-state device according to the first embodiment of the present invention will now be more fully described. Here, if the two inputs A and B have different logic levels (e.g., A=0 & B=1 or A=1 & B=0), the pull-down transistor PMN will turn on, thereby eliminating any floating state at the output Y. That is, if A=0 and B=1, these signals are inverted to the logic "high" and "low" levels via the inverters IG1 and IG2, respectively. In response, PMOS transistor MP1 and NMOS transistor MN1 are turned on and the PMOS transistor MP2 and NMOS transistor MN2 are turned off. The output Y of the tri-state device then enters the high impedance state "Z". However, since the exclusive OR gate (XOR) is connected to the first and second input nodes N1 and N2, the XOR gate outputs a logic "high" signal to the gate of the pull-down transistor PMN. Once the pull-down transistor PMN turns on, the output signal line INA is pulled to VSS. Thus, the high impedance state of the tri-state device is converted to a logic "low" state. This is also true for the case where A=1 and B=0.

However, if these two inputs A and B are logic "high", the PMOS transistors will turn on and pull output Y to a logic 1 potential, the NMOS transistors MN1 and MN2 will turn off and the output of the XOR gate will be set at a logic 0 potential to turn the pull-down transistor PMN off. This isolates the output signal line INA from VSS and eliminates any direct current path between VCC and VSS.

TABLE 4

| Node | Case 1 | Case 2 | Case 3 | Case 4 |
|---|---|---|---|---|
| A | 0 | 0 | 1 | 1 |
| B | 0 | 1 | 0 | 1 |
| Y | 0 | Z | Z | 1 |
| INA | VSS | VSS | VSS | VCC |
| Current path | No | No | No | No |

Figure 4:
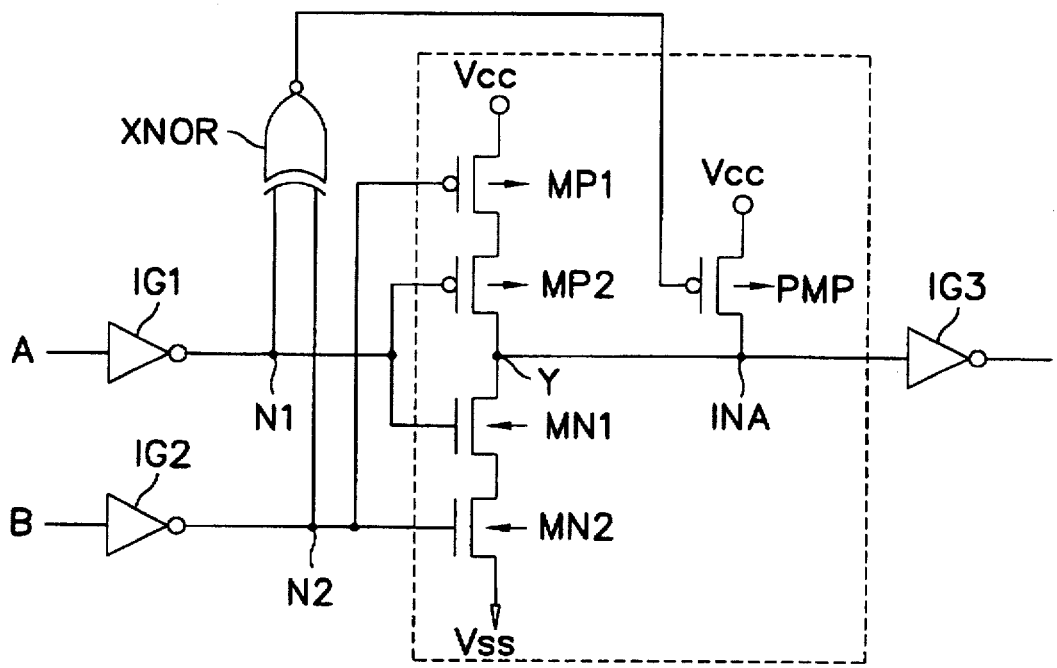
FIG. 4 is an electrical schematic of a tri-state device according to a second embodiment of the present invention.

Referring now to FIG. 4, a tri-state device according to a second embodiment of the present invention is illustrated. According to this second embodiment, first and second NMOS transistors MN1 and MN2 are electrically connected in series between an output Y of the tri-state device and VSS (e.g., GND) and first and second PMOS transistors MP1 and MP2 are electrically connected in series between the output Y and the power supply potential (i.e., VCC). First and second inverters IG1 and IG2 are also provided in series between the gate electrodes of the NMOS and PMOS transistors and the inputs A and B, as illustrated. As will be understood by those skilled in the art, whenever inputs A and B are both switched to logic 1 potentials, the output Y of the tri-state device will be pulled up to VCC. Alternatively, whenever inputs A and B are both switched to logic 0 potentials, the output Y will be pulled down to VSS. However, according to the present invention, a two-input exclusive NOR (XNOR) gate is preferably connected between nodes N1 and N2, as illustrated, and a gate electrode of a normally-off PMOS pull-up transistor (PMP). Alternatively, a two-input exclusive OR (XOR) gate and an NMOS pull-up transistor (not shown) can be used in place of the illustrated XNOR gate and PMOS transistor. Thus, the output signal line INA will also be pulled up to VCC whenever the inputs A and B are at different logic potentials because a logic 0 output will be generated by the XNOR gate to turn on the PMOS pull-up transistor PMP. But, because the output of the XNOR gate remains at a logic 1 potential whenever the inputs A and B are the same, the PMOS pull-up transistor PMP will remain nonconductive when the inputs A and B are the same. Thus, any high current path between VCC and VSS is eliminated even when the NMOS transistors MN1 and MN2 are turned on.

In particular, referring now to FIG. 4 and Table 5, the operation of the tri-state device according to the second embodiment of the present invention will now be more fully described. Here, if the two inputs A and B have different logic levels (e.g., A=0 & B=1 or A=1 & B=0), the PMOS pull-up transistor PMP will turn on, thereby eliminating any floating state at the output Y. That is, if A=0 and B=1, these signals are inverted to the logic "high" and "low" levels via the inverters IG1 and IG2, respectively. In response, PMOS transistor MP1 and NMOS transistor MN1 are turned on and the PMOS transistor MP2 and NMOS transistor MN2 are turned off.

The output Y of the tri-state device then enters the high impedance state.

However, since the exclusive NOR gate (XNOR) is connected to the first and second input nodes N1 and N2, the XNOR gate outputs a logic "low" signal to the gate of the PMOS pull-up transistor PMP. Once the pull-up transistor PMP turns on, the output signal line INA is pulled to VCC. Thus, the high impedance state of the tri-state device is converted to a logic "high" state. This is also true for the case where A=1 and B=0.

However, if these two inputs A and B are logic "high", the PMOS transistors will turn on and pull output Y to a logic 1 potential, the NMOS transistors MN1 and MN2 will turn off and the output of the XNOR gate will be set at a logic 1 potential to turn the pull-up transistor PMP off. This isolates the output signal line INA from VCC and eliminates any direct current path between VCC and VSS.

TABLE 4

| Node | Case 1 | Case 2 | Case 3 | Case 4 |
|---|---|---|---|---|
| A | 0 | 0 | 1 | 1 |
| B | 0 | 1 | 0 | 1 |
| Y | 0 | Z | Z | 1 |
| INA | VSS | VCC | VCC | VCC |
| Current path | No | No | No | No |

As described above with reference to FIGS. 3 and 4, it is possible to remove the floating state of the output signal line INA and to isolate the current path by using the combinational circuit, e.g. the exclusive OR gate XOR and NMOS pull-down transistor PMN or the exclusive NOR gate XNOR and PMOS pull-up transistor PMP (or exclusive NOR gate and PMOS pull-down transistor or the exclusive OR gate and NMOS pull-up transistor). This enables a remarkable reduction in the total power consumption of the device. Therefore, the circuit for stabilizing the output of the tri-state circuit according to the present invention can stabilize the operation of the tri-state circuit by preventing the floating state and can isolate the unnecessary current path thereby reducing power consumption.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A tri-state device having exclusive gate output control, comprising:

a tri-state device having first and second inputs and a tri-state output;

a normally-off transistor connected in series between the tri-state output and a first reference potential; and an exclusive gate having first and second inputs coupled to the first and second inputs of said tri-state device, respectively, and an output electrically coupled to a control electrode of said normally-off transistor so that the tri-state output becomes electrically connected through the normally-off transistor to the first reference potential whenever the first and second inputs of said tri-state device are at different logic potentials.

2. The tri-state device of claim 1, wherein said exclusive gate is selected from the group consisting of exclusive OR and exclusive NOR gates.

3. The tri-state device of claim 1, wherein said tri-state device comprises a pair of PMOS transistors electrically connected in series between the tri-state output and the first reference potential, and a pair of NMOS transistor electrically connected in series between the output and a second reference potential.

4. The tri-state device of claim 1, wherein said tri-state device comprises a pair of NMOS transistors electrically connected in series between the tri-state output and the first reference potential, and a pair of PMOS transistor electrically connected in series between the output and a second reference potential.

5. The tri-state device of claim 2, wherein said normally-off transistor is selected from the group consisting of NMOS and PMOS transistors.

6. The tri-state device of claim 3, wherein said normally-off transistor comprises an NMOS transistor and wherein said exclusive gate comprises an exclusive OR gate.

7. The tri-state device of claim 3, wherein said normally-off transistor comprises a PMOS transistor and wherein said exclusive gate comprises an exclusive NOR gate.

8. The tri-state device of claim 4, wherein said normally-off transistor comprises an NMOS transistor and wherein said exclusive gate comprises an exclusive OR gate.

9. The tri-state device of claim 4, wherein said normally-off transistor comprises a PMOS transistor and wherein said exclusive gate comprises an exclusive NOR gate.

* * * * *